(12) United States Patent
Izumi et al.

(10) Patent No.: US 7,077,875 B2
(45) Date of Patent: Jul. 18, 2006

(54) MANUFACTURING DEVICE FOR BURIED INSULATING LAYER TYPE SINGLE CRYSTAL SILICON CARBIDE SUBSTRATE

(75) Inventors: Katsutoshi Izumi, Osaka (JP); Motoi Nakao, Osaka (JP); Yoshiaki Ohbayashi, Nara (JP); Keiji Mine, Osaka (JP); Seisaku Hirai, Osaka (JP); Fumihiko Jobe, Osaka (JP); Tomoyuki Tanaka, Osaka (JP)

(73) Assignees: Osaka Prefecture, Osaka (JP); Hosiden Corporation, Osaka (JP)

( * ) Notice: Subject to any disclaimer, the term of this patent is extended or adjusted under 35 U.S.C. 154(b) by 11 days.

(21) Appl. No.: 11/050,683

(22) Filed: Feb. 7, 2005

(65) Prior Publication Data

US 2005/0136611 A1 Jun. 23, 2005

Related U.S. Application Data

(62) Division of application No. 10/708,593, filed on Mar. 12, 2004.

(30) Foreign Application Priority Data

Mar. 26, 2003 (JP) ............................... 2003-84056

(51) Int. Cl.
*H01L 21/00* (2006.01)
*H01L 21/64* (2006.01)

(52) U.S. Cl. .................... 29/25.01; 118/695; 118/723 R (58) Field of Classification Search ................ 29/25.01; 118/695, 723 R
See application file for complete search history.

(56) References Cited

U.S. PATENT DOCUMENTS

| 4,855,210 | A | | 8/1989 | Hirooka et al. ............. 430/133 |
| 5,048,163 | A | * | 9/1991 | Asmus et al. ............... 29/25.01 |
| 5,436,172 | A | * | 7/1995 | Moslehi ...................... 374/121 |
| 5,759,908 | A | | 6/1998 | Steckl et al. ................ 438/479 |
| 5,849,043 | A | * | 12/1998 | Zhang et al. ............... 29/25.01 |
| 5,880,491 | A | | 3/1999 | Soref et al. .................. 257/190 |
| 6,776,805 | B1 | * | 8/2004 | Hasegawa et al. .......... 29/25.01 |
| 2004/0209190 | A1 | * | 10/2004 | Mori et al. .................. 430/311 |

FOREIGN PATENT DOCUMENTS

| EP | 0 454 456 A1 | 10/1991 |
| EP | 0 463 266 A1 | 1/1992 |
| EP | 1 265 274 A2 | 12/2002 |
| JP | 6-191997 | 7/1994 |

* cited by examiner

OTHER PUBLICATIONS

European Search Report dated Dec. 16, 2005.

*Primary Examiner*—Michelle Estrada
(74) *Attorney, Agent, or Firm*—Armstrong, Kratz, Quintos, Hanson & Brooks, LLP (57) ABSTRACT

Provided is a manufacturing method of a buried insulating layer type semiconductor silicon carbide substrate excellent in flatness of an interfaces in contact the insulating layer and a manufacturing device thereof. In the manufacturing device, an SOI substrate having a buried insulating layer positioned on a silicon substrate and a surface silicon layer formed on this buried insulating layer is placed in this film formation chamber. The manufacturing device includes: the film formation chamber in which the SOI substrate is placed; a gas supplying unit for supplying various types of gasses required for the manufacturing of a buried insulating layer type semiconductor silicon carbide substrate into the film formation chamber; an infrared ray irradiating unit for irradiating the surface silicon layer of the SOI substrate with infrared rays; and a control part for controlling the gas supplying unit and the infrared ray irradiating unit.

9 Claims, 4 Drawing Sheets

MANUFACTURING DEVICE FOR BURIED INSULATING LAYER TYPE SINGLE CRYSTAL SILICON CARBIDE SUBSTRATE

This application is a Divisional of prior application Ser. No. 10/708,593 filed on Mar. 12, 2004 now U.S. Pat. No. 6,927,144.

BACKGROUND OF THE INVENTION

1. Field of the Invention

The present invention relates to a method for manufacturing a buried insulating layer type semiconductor silicon carbide substrate and a manufacturing device for the same. Concretely speaking, the present invention relates to a high performance silicon carbide substrate that has potential to be used as a next generation semiconductor substrate and that has an SOI structure allowing a low-loss, high-speed device.

2. Description of the Related Art

Manufacturing methods for manufacturing a buried insulating layer semiconductor silicon carbide substrate of this type include the step of heating the surface of an SOI substrate so that the surface silicon layer of this SOI substrate is metamorphosed to a single crystal silicon carbide thin film. In this step, the temperature of the entire stage for supporting an SOI substrate is raised (see Patent Literature 1) or the temperature of the entire atmosphere in the film formation chamber is raised. Here, these heating systems for raising the temperature include a resistance heating system and an induction heating system.

[Patent Literature 1]

Japanese Unexamined Patent Publication No. 06-191997 (1994) (see paragraph 0008 of the specification and FIG. 1)

When a heating system as described above is used in the above-described step, however, the entirety of the SOI substrate is heated. That is to say, a portion of the SOI substrate, which is not desired to be heated, is heated along with the surface silicon layer portion, which is required to be heated, and, therefore, the buried insulating layer directly beneath this surface silicon layer is softened or melted causing a lump of the surface silicon layer that has not been metamorphosed into a single crystal silicon carbide thin film to be buried into the buried insulating layer. As a result, a manufacturing method that includes the above described step has a problem, wherein, the flatness of the interface between the above-described single crystal silicon carbide thin film and the above-described buried insulating layer is deteriorated.

In addition, in the case where the film formation chamber is attempted to be heated from the outside in the above-described step, using a resistance heating system, another problem arises, wherein, the size of the device increases. In the case where the temperature of the stage is attempted to be raised using a resistance heating system, it is necessary to, while maintaining the air tightness, provide wiring equipment for energizing the heater for raising the temperature of the stage, and as a result, another problem occurs wherein the configuration of the device becomes complicated.

On the other hand, in the case where the temperature of the entire film formation chamber, or the stage, is raised using an induction heating system, though wiring equipment is unnecessary within the film formation chamber, another problem occurs wherein, the size of the device increases in the same manner as in the resistance heating system, because the entire film formation chamber, or the stage, is heated from the outside. In addition, another problem occurs when electromagnetic interference is easily caused in a peripheral apparatus due to induction.

SUMMARY OF THE INVENTION

The present invention is developed in view of the above-described situation, and an object thereof is to provide a method for manufacturing a buried insulating layer type semiconductor silicon carbide substrate that does not have the above-described problem, and a manufacturing device for the same.

In order to solve the above-described problems, a method for manufacturing a buried insulating layer type semiconductor silicon carbide substrate according to the present invention is a method for manufacturing a buried insulating layer type single crystal silicon carbide substrate within a film formation chamber after placing, in this film formation chamber, an SOI substrate having a buried insulating layer positioned on a silicon substrate and a surface silicon layer formed on this buried insulating layer, characterized by comprising: the first step of irradiating the surface silicon layer of the SOI substrate with infrared rays while supplying a mixed gas of hydrogen gas hydrocarbon gas into the film formation chamber and, thereby, raising the temperature of the surface silicon layer to that required for metamorphosing the surface silicon layer into a single crystal silicon carbide thin film wherein this condition is maintained for a predetermined period of time so that the surface silicon layer is metamorphosed into the single crystal silicon carbide thin film; the second step of maintaining the same condition as of the above-described first step and, thereby, depositing a carbon thin film on the above-described single crystal silicon carbide thin film; the third step of replacing the above-described mixed gas with an inert gas mixed with oxygen gas with a predetermined ratio and at the same time adjusting the temperature of the above-described carbon thin film to that required for etching and removing the carbon thin film through the control of the irradiation of the infrared rays wherein this condition is maintained at a predetermined period of time so that the carbon thin film is etched and removed; and the fourth step of replacing the above-described inert gas with a pure inert gas with no oxygen gas mixed in and after that, the temperature of the above-described single crystal silicon carbide thin film to that required for making a new single crystal silicon carbide thin film grow on the above-described single crystal silicon carbide thin film through the control of the irradiation of the infrared rays while supplying a mixed gas of hydrogen gas and a silane based gas into the pure inert gas atmosphere wherein this condition is maintained for a predetermined period of time so that a new single crystal silicon carbide thin film is made to grow on the single crystal silicon carbide thin film.

A manufacturing device for a buried insulating layer type semiconductor silicon carbide substrate according to the present invention is a device for manufacturing a buried insulating layer type single crystal silicon carbide substrate within a film formation chamber after placing, in this film formation chamber, an SOI substrate having a buried insulating layer positioned on a silicon substrate and a surface silicon layer formed on this buried insulating layer, characterized by comprising: a film formation chamber in which the SOI substrate is placed; gas supplying means for supplying various types of gasses required for the manufacture of the buried insulating layer type semiconductor silicon carbide substrate into the film formation chamber; infrared ray irradiating means for irradiating the surface silicon layer of the SOI substrate with infrared rays; and control means for controlling the gas supplying means and the infrared ray irradiating means, wherein the above-described control part irradiates the surface silicon layer of the SOI substrate with the infrared rays while supplying a mixed gas of hydrogen gas and hydrocarbon gas into the film formation chamber and, thereby, the temperature of the surface silicon layer is raised to that required for metamorphosing the surface silicon layer into a single crystal silicon carbide thin film wherein this condition is maintained at a predetermined period of time and a process is carried out so that this surface silicon layer is metamorphosed into the single crystal silicon carbide thin film; after this process, this process is continued for a predetermined period of time and, thereby, a carbon thin film is deposited on the above-described single crystal silicon carbide thin film; after that, the above-described mixed gas is replaced with an inert gas with oxygen gas mixed at a predetermined ratio and at the same time, the irradiation of the infrared rays is controlled so as to achieve the temperature required for etching and removing the above-described carbon thin film wherein this condition is maintained for a predetermined period of time and a process is carried out for etching and removing this carbon thin film; after this process, the above-described inert gas is replaced with a pure inert gas with no oxygen gas mixed in; after that, a mixed gas of hydrogen gas and silane based gas is supplied into the pure inert gas atmosphere while the irradiation of the infrared rays is controlled so as to achieve the temperature required for making a new single crystal silicon carbide thin film grow on the above-described single crystal silicon carbide thin film wherein this condition is maintained for a predetermined period of time and a process is carried out so that a new single crystal silicon carbide thin film is made to grow on the single crystal silicon carbide thin film.

DESCRIPTION OF THE PREFERRED EMBODIMENTS

Figure 1:
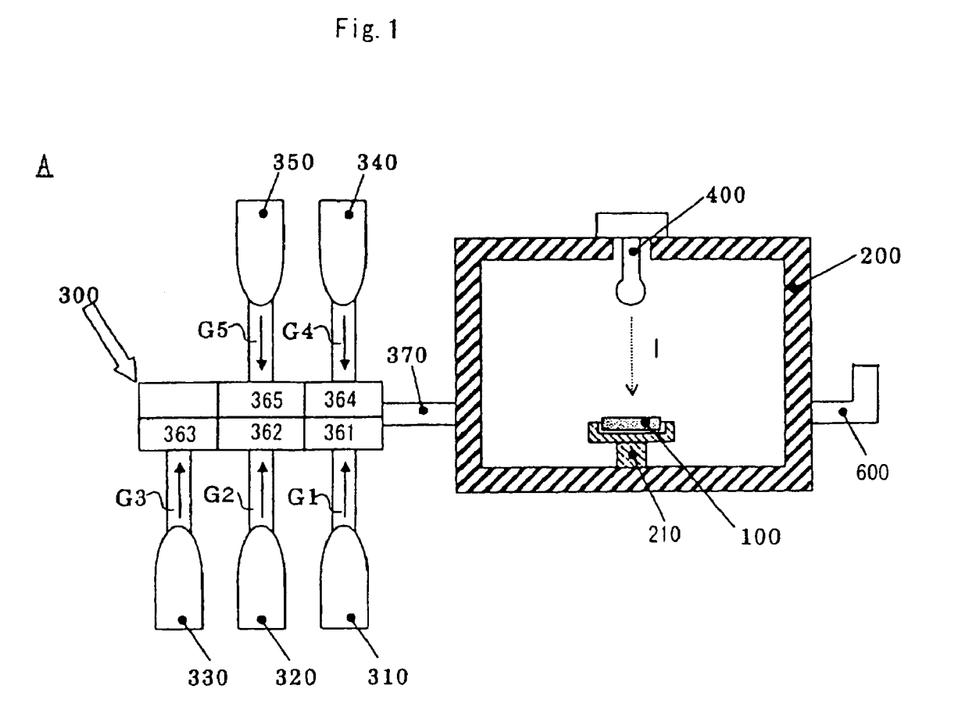
FIG. 1 is a schematic diagram showing a manufacturing device for implementing a manufacturing method for a buried insulating layer type semiconductor silicon carbide substrate according to an embodiment of the present invention.
Figure 2:
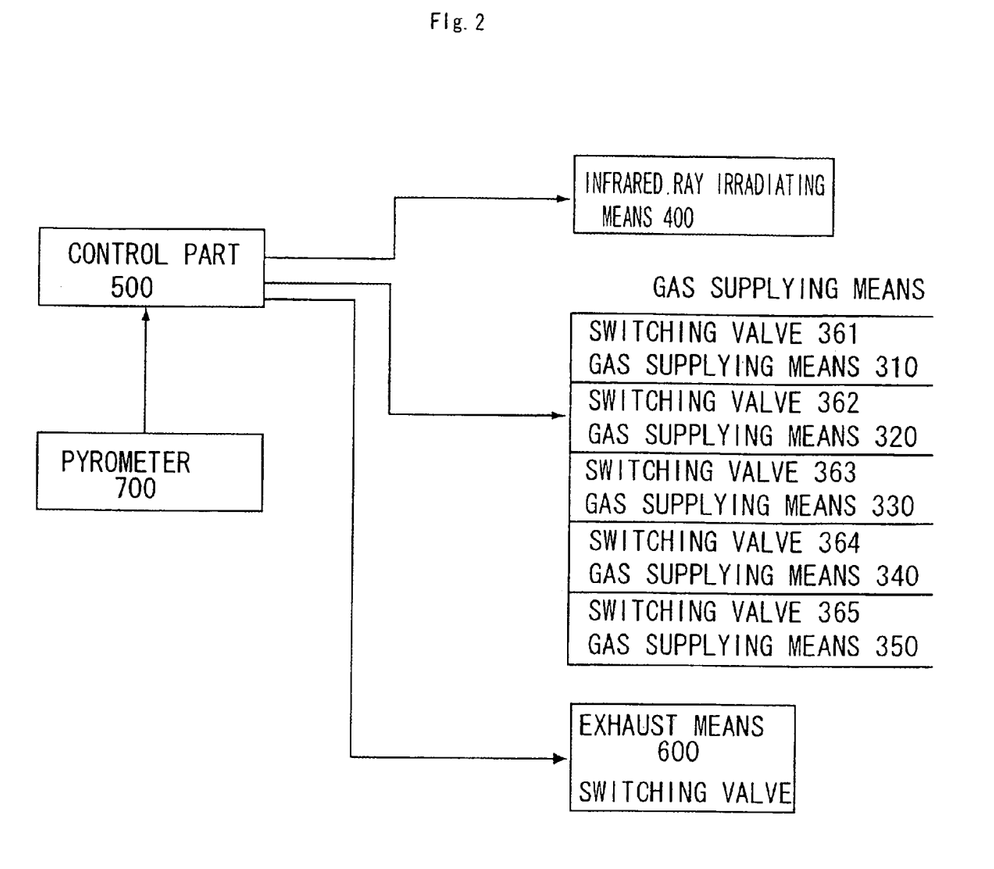
FIG. 2 is a block diagram showing a control part of the above-described manufacturing device.
Figure 3:
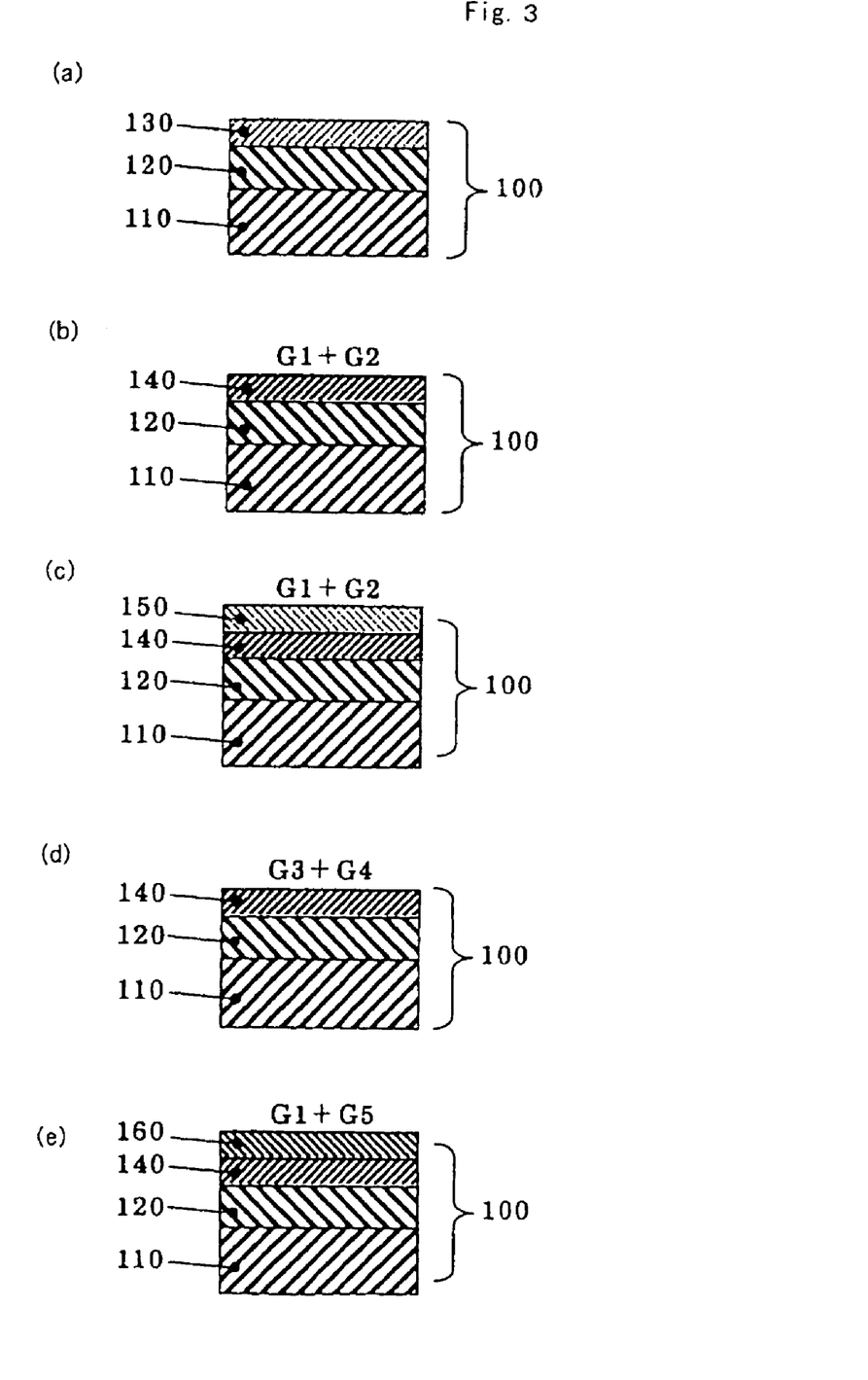
FIGS. 3(a) to 3(e) are schematic diagrams showing the respective steps in a method for manufacturing a buried insulating layer type semiconductor silicon carbide substrate according to an embodiment of the present invention.
Figure 4:
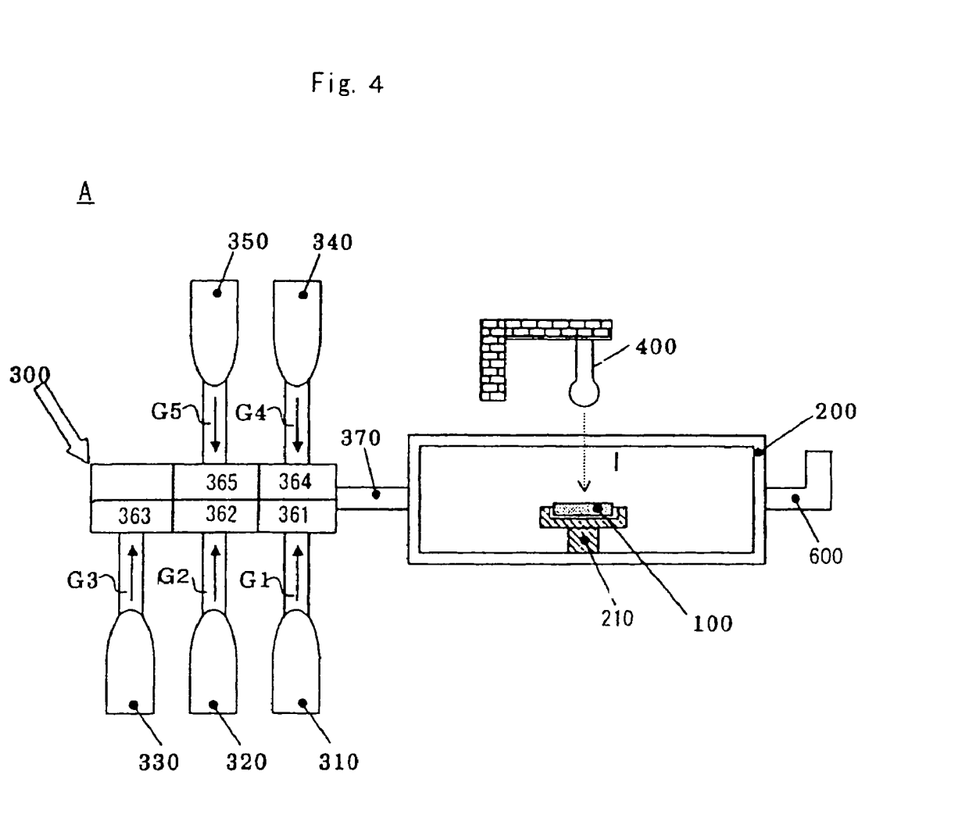
FIG. 4 is a schematic diagram showing an example of a modified design of the manufacturing device for a buried insulating layer type semiconductor silicon carbide substrate according to an embodiment of the present invention.

In the following, a method for manufacturing a buried insulating layer type semiconductor silicon carbide substrate and a manufacturing device for the same according to the embodiments of the present invention are described in reference to the drawings. FIG. 1 is a schematic diagram showing a manufacturing device for a buried insulating layer type semiconductor silicon carbide substrate according to an embodiment of the present invention; FIG. 2 is a block diagram showing a control part of the above-described manufacturing device; FIGS. 3(a) to 3(e) are schematic diagrams showing the steps of a method for manufacturing a buried insulating layer type semiconductor silicon carbide substrate according to an embodiment of the present invention; and FIG. 4 is a schematic diagram showing an example of a modified design of the manufacturing device for a buried insulating layer type semiconductor silicon carbide substrate according to an embodiment of the present invention. Here, FIG. 1 clarifies surrounding gases in the respective steps of the method for manufacturing a buried insulating layer type semiconductor silicon carbide substrate. In addition, the measures of thickness of the respective layers in FIG. 3 are not proportionate to the actual thicknesses of the layers, for the convenience of the illustration.

A manufacturing device A of a buried insulating layer type semiconductor silicon carbide substrate cited herein is a device for manufacturing a buried insulating layer type single crystal silicon carbide substrate within a film formation chamber 200 wherein, an SOI substrate 100 having a buried insulating layer 120 placed on a silicon substrate 110 and a surface silicon layer 130 formed on this buried insulating layer 120 is placed within the above-described film formation chamber 200 and is provided with: the film formation chamber 200 in which the SOI substrate 100 is placed; a gas supplying means 300 for supplying various types of gases required for the manufacturing of a buried insulating layer type semiconductor silicon carbide substrate to the film formation chamber 200; an infrared ray irradiating means 400 for irradiating the surface silicon layer 130 of the SOI substrate 100 with infrared rays I; and a control part 500 for controlling the gas supplying means 300 and the infrared ray irradiating means 400. In the following, each of the parts is described in detail.

The SOI substrate 100 is an SIMOX (separation by Implanted Oxygen) substrate (see FIG. 3(a)). The film thickness of the surface silicon layer 130 of this SOI substrate is 10 nm or less and is concretely between 2 nm and 4 nm. Here, it is also possible to use SOI substrates 100 which are not SIMOX substrates.

The film formation chamber 200 is formed of crystal or the like as shown in FIG. 1 and a stage 210 on which the SOI substrate 100 is placed is positioned inside the film formation chamber 200. This stage 210 is formed of crystal or ceramics. As for the types of crystal, there are transparent crystal, opaque crystal, black crystal and the like having different absorptions of infrared rays, respectively. That is to say, different types of crystal are heated to different degrees by means of the infrared rays I. As a result, the quality of the crystal is selected appropriately in the case when crystal is used in the stage 210 taking into consideration the effects of the material to the temperature of the mounting surface of the SOI substrate 100. Here, the SOI substrate 100 and the like are placed into and removed from the chamber through an entrance which is not shown.

The infrared ray irradiating means 400 is attached to this film formation chamber 200 at a position opposite to the SOI substrate 100 placed on the stage 220. In addition, a pyrometer 700 (see FIG. 2) for measuring the inside temperature of the film formation chamber 200 is placed outside of the film formation chamber 200 so as to face the inside of the film formation chamber 200.

The gas supplying means 300 for supplying various types of gases to the inside of the film formation chamber 200 and an exhaust means 600 for exhausting the above-described various types of gases are attached to the film formation chamber 200. Here, the inside pressure of the film formation chamber 200 is set at a level equivalent to the atmospheric pressure.

The gas supplying means 300 has a hydrogen gas supplying part 310 for supplying hydrogen gas G1, a hydrocarbon gas supplying part 320 for supplying hydrocarbon gas G2, an oxygen gas supplying part 330 for supplying oxygen gas G3, an inert gas supplying part 340 for supplying argon gas as inert gas G4 (including a pure inert gas) and a silane based gas supplying part 350 for supplying silane based gas G5. These gas supplying parts 310 to 350 are connected to switching valves 361 to 365 respectively and are connected to the film formation chamber 200 via a supplying pipe 370. Here, an appropriate method for supplying a mixed gas is selected depending on the purpose.

The hydrogen gas G1 is a carrier gas. Propane gas is used as the hydrocarbon gas G2, argon gas is used as the inert gas G4 and monomethyl silane gas that includes silicon atoms and carbon atoms is used as the silane based gas G5. Here, dimethyl silane gas, trimethyl silane gas and the like, in addition to monmethyl silane gas, that include silicon atoms and carbon atoms can be utilized as the silane based gas G5.

The infrared ray irradiating means 400 is a general infrared ray irradiating device for outputting infrared rays I having a wavelength of approximately 800 nm and the lamp part thereof is placed inside the film formation chamber 200. On the other hand, the wiring equipment of the infrared ray irradiating means 400 is positioned outside the film formation chamber 200. The infrared ray irradiating means 400 is formed in such a manner that the position thereof is adjustable. Concretely speaking, the infrared ray irradiating means 400 has a mechanism having an X-axis, a Y-axis and a rotational axis so that this mechanism is controlled by the control part 500. As a result, irradiation region and irradiation angle of the infrared rays I can be adjusted appropriately if necessary. Here, the position of the infrared ray irradiating means 400 is set in a manner that the entire surface of the surface silicon layer 130 of the SOI substrate 100 is irradiated with the infrared rays I. Here, the position of the infrared ray irradiating means 400 can be adjusted so that the surface silicon layer 130 is metamorphosed locally to the single crystal silicon carbide thin film 140. The infrared ray irradiating means 400 may be able to output near and far infrared rays (of which the wavelength ranges from approximately 700 nm to 2500 nm).

Here, a sequencer is used as the control part 500 and the pyrometer 700 is electrically connected to the input port of the control part 500 while the switching valves 361 to 365, the switching valve of the exhaust means 600 and the infrared ray irradiating means 400 are electrically connected to the output port of the control part 500. The control part 500 is formed in a manner that ON/OFF of each part is controlled based on a predetermined sequential pattern while inputting the measurement result of the pyrometer 700.

In the following, the control method of the control part 500 of the control device A and the method for manufacturing a buried insulating layer type semiconductor silicon carbide substrate using this control device A are described. First, the SOI substrate 100 is placed on the stage 210 within the film formation chamber 200.

After that, the switching valves 361 and 362 are switched and the hydrogen gas G1 is forced to eject from the hydrogen gas supplying part 310 at a rate of 1000 cc/minute and the hydrocarbon gas G2 is forced to eject from the hydrocarbon gas supplying part 320 at a rate of 10 cc/minute, respectively. As a result, a mixed gas (G1+G2) is supplied into the film formation chamber 200. On the other hand, the infrared ray irradiating means 400 is energized so that the surface silicon layer 130 of the SOI substrate 100 is irradiated with the infrared rays I. As a result, the temperature of the surface silicon layer 130 is raised to the temperature (approximately 1200° C.) required for metamorphosing this surface silicon layer 130 into a single crystal silicon carbide thin film 140 so that this condition is maintained for 30 minutes and, thereby, this surface silicon layer 130 is metamorphosed into the single crystal silicon carbide thin film 140 (first step, see FIG. 3(b)).

As described above, the temperature (approximately 1200° C.) required for metamorphosing the surface silicon layer 130 of the SOI substrate 100 into the single crystal silicon carbide thin film 140 is gained solely by means of the infrared rays I and thus, the surface silicon layer 130 absorbs the infrared rays I so that the temperatures thereof becomes approximately 1200° C. On the other hand, the buried insulating layer 120 absorbs almost no infrared rays I and the temperature thereof becomes of a value as low as approximately 250° C. due to thermal conduction from the surface silicon layer 130 and the like. That is to say, the temperature of the buried insulating layer 120 does not increase in the same manner as the surface silicon layer 130 unlike the prior art and this temperature stays at a level as low as approximately 250° C. so as not to cause unnecessary changes such as melting or softening. Here, the temperature required for metamorphosing the surface silicon layer 130 of the SOI substrate 100 into the single crystal silicon carbide thin film 140 may be in a range of from 500° C. to 1450° C.

After the above-described first step, the same condition as described above of this first step is further maintained for 30 minutes and, thereby, a carbon thin film 150 is deposited on the single crystal silicon carbide thin film 140 (second step, see FIG. 3(c)).

After this second step, the switching valves 363 and 364 are switched and the inert gas G4 is forced to eject from the inert gas supplying part 340 at a rate of 1000 cc/minute and the oxygen gas G3 is forced to eject from the oxygen gas supplying part 330 at a rate of 100 cc/minute, respectively. As a result, a mixed gas (G3+G4) is supplied into the film formation chamber 200. At the same time, the switching valve of the exhaust means 600 is open for a predetermined period of time and, thereby, the mixed gas (G1+G2) is exhausted to the outside of the film formation chamber 200. The mixed gas (G1+G2) is replaced with the mixed gas (G3+G4) in the above-described manner. On the other hand, the period of time for energizing, the supplied power and the like of the infrared ray irradiating means 400 are controlled so that the temperature of the carbon thin film 150 is raised to the temperature (550° C. or higher) required for etching and removing this carbon thin film 150 and this condition is maintained for 10 minutes and, thereby, this carbon thin film 150 is etched and removed (third step, see FIG. 3(d)).

When the temperature of the carbon thin film 150 is maintained at 550° C. or higher for 10 minutes in the above-described manner, this carbon thin film 150 leads to a chemical change such as C+O→CO or C+O$_2$→CO$_2$, so that the carbon is changed into carbon monoxide gas or carbon dioxide gas. As a result, the carbon thin film 150 is etched and removed.

After the third step, the switching valve 364 is switched so that the inert gas G4 is forced to eject from the inert gas supplying part 340. As a result, the inert gas G4 is supplied into the film formation chamber 200. At the same time, the switching valve of the exhaust means 600 is open for a predetermined period of time and, thereby, the mixed gas (G3+G4) is exhausted to the outside of the film formation chamber 200. The mixed gas (G3+G4) is replaced with the above-described inert gas G4 in the above-described manner. As described above, the mixed gas (G3+G4) is replaced with a pure inert gas G4 and, thereby, a risk of an explosive reaction between the oxygen gas G3 and the below described silane based gas can be avoided.

After that, the switching valves 361 and 365 are switched and the hydrogen gas G1 is forced to eject from the hydrogen gas supplying part 310 at a rate of 1000 cc/minute and the silane based gas G4 is forced to eject from the silane based gas supplying means 350 at a rate of 10 cc/minute, respectively. As a result of this, a mixed gas (G1+G5) is supplied into the film formation chamber 200. On the other hand, the period of time of energizing, the supplied power and the like of the infrared ray irradiating means 400 are controlled so as to achieve the temperature (approximately 1200° C.) required for making a new single crystal silicon carbide thin film 160 grow on the single crystal silicon carbide thin film 140 and this condition is maintained for 30 minutes so that the new single crystal silicon carbide thin film 160 is made to grow on this single crystal silicon carbide thin film 140 (fourth step, see FIG. 3(e)).

The silane based gas G5 is decomposed and causing a reaction on the single crystal silicon carbide thin film 140 in the above-described manner, and thereby another single crystal silicon carbide thin film 160 is formed on the single crystal silicon carbide thin film 140. Here, the temperature required for making the new single crystal silicon carbide thin film 160 grown on the single crystal silicon carbide thin film 140 is in a range of from 500° C. to 1450° C.

As described above, a buried insulating layer type single crystal silicon carbide substrate having the single crystal silicon carbide thin films 140 and 160 is manufactured.

In the case that such a manufacturing device A is used and in the case of a manufacturing method using this, the surface silicon layer 130 of the SOI substrate 100 is irradiated with the infrared rays I so that the temperature of surface silicon layer 130 is raised to that required for metamorphosing the surface silicon layer 130 into the single crystal silicon carbide thin film 140 solely by means of the infrared rays I and therefore, the temperature of the buried insulating layer 120 that absorbs almost no infrared rays I is not raised to a great amount. As a result, the buried insulating layer 120 can be prevented from being softened or melted and a lump of the surface silicon layer 130 that has not been metamorphosed into the single crystal silicon carbide thin film 140 can be prevented from being buried into this buried insulating layer 120 and as a result, a buried insulating layer type single crystal silicon carbide substrate having a high degree of flatness in the interface between the single crystal silicon carbide thin films 140, 160 and the buried insulating layer 120 can be gained.

Here, though the position of the infrared ray irradiating means 400 was described as being adjustable, the structure thereof is not necessarily limited to such and the infrared ray irradiating means 400 may be fixed into the film formation chamber 200 so that the surface silicon layer 130 of the SOI substrate 100 is irradiated with the infrared rays I with an appropriate output level. In addition, as shown in FIG. 4, the infrared ray irradiating means 400 may be provided outside the film formation chamber 200 in such a manner that its position can be adjusted. In this case, the film formation chamber 200 is formed of a transparent crystal. This transparent crystal absorbs almost no infrared rays and therefore, the surface silicon layer 130 of the SOI substrate 100 can be irradiated with the infrared rays I through walls of the film formation chamber 200. In addition, the temperature of the walls of this film formation chamber 200 does not increase preventing the occurrence of undesired decomposition of gases in the vicinity of these walls. The position of the infrared ray irradiating means 400 can be changed in the above-described manner, and therefore, the irradiated region, irradiating angle and the like can easily be adjusted before the first step for greater versatility in the same manner as in the above-described embodiment while the surface silicon layer 130 can be locally metamorphosed into the single crystal silicon carbide thin film 140.

In the case when the surface silicon layer 130 is locally metamorphosed into the single crystal silicon carbide thin film 140, an electronically and optically fused device where an electronic device and an optic device are mixed on the same substrate can be manufactured when gallium nitride is deposited on this single crystal silicon carbide thin film 140 for the manufacture of the optical device.

Though various types of gases G1 to G5 are filled into the respective gas supplying parts 310 to 350 so that the various types of gases G1 to G5 can be forced to eject respectively according to the above description, a gas (gases mixed according to a predetermined ratio in the case of a mixed gas) required in each step may be filled into each gas supplying part so that this gas can be forced to eject.

Here, the type where various types of gases are separately supplied has a flexibility higher than that of the type where various types of gases mixed in advance according to a predetermined ratio are supplied regarding the point of view that the former type allows for an easy change of the mixture ratio of the various types of gases corresponding to a variety of chemical reactions.

Here, though a mixture gas of the gas silane based gas G5 that includes silicon atoms and carbon atoms, as the silane based gas G5, and the hydrogen gas G1 is supplied in the above-described fourth step of the above-described manufacturing method, monosilane gas, disilane gas, dichlorosilane gas or the like which includes silicon atoms but does not include carbon atoms may be used as the silane based gas G5 so that a mixture gas of such silane based gas G5, hydrogen gas G1 and hydrocarbon gas G2 may be supplied. Here, a method for supplying for the mixed gas is selected in accordance with the purpose.

As described above, a method for manufacturing a buried insulating layer type semiconductor silicon carbide substrate according to the present invention is a method for manufacturing a buried insulating layer type single crystal silicon carbide substrate within a film formation chamber after placing, in this film formation chamber, an SOI substrate having a buried insulating layer positioned on a silicon substrate and a surface silicon layer formed on this buried insulating layer, characterized by comprising a first step of irradiating the surface silicon layer of the SOI substrate with infrared rays while supplying a mixed gas of hydrogen gas and hydrocarbon gas into the film formation chamber and, thereby, raising the temperature of the surface silicon layer to that required for metamorphosing the surface silicon layer into a single crystal silicon carbide thin film wherein this condition is maintained for a predetermined period of time so as to metamorphose the surface silicon layer into the single crystal silicon carbide thin film.

In the case of such a manufacturing method, the surface silicon layer of the SOI substrate is irradiated with infrared rays so that the temperature of the surface silicon layer is raised to that required for metamorphosing the surface silicon layer to a single crystal silicon carbide thin film solely by means of the infrared rays and, therefore, the temperature of the buried insulating layer that absorbs almost no infrared rays is not raised greatly. As a result, the above-described buried insulating layer can be prevented from being softened or melted and a lump of the surface silicon layer that has not been metamorphosed into a single crystal silicon carbide thin film can be prevented from being buried into this buried insulating layer. Accordingly, a buried insulating layer type single crystal silicon carbide substrate having a high degree of flatness in the interface between the single crystal silicon carbide thin films and the buried insulating layer can be gained.

A manufacturing device for a buried insulating layer type semiconductor silicon carbide substrate according to the present invention is a device for manufacturing a buried insulating layer type single crystal silicon carbide substrate within a film formation chamber after placing, in this film formation chamber, an SOI substrate having a buried insulating layer positioned on a silicon substrate and a surface silicon layer formed on this buried insulating layer, comprising: a film formation chamber in which an SOI substrate is placed; gas supplying means for supplying various types of gasses required for the manufacture of the buried insulating layer type semiconductor silicon carbide substrate into the film formation chamber; infrared ray irradiating means for irradiating the surface silicon layer of the SOI substrate with infrared rays; and control means for controlling the gas supplying means and the infrared ray irradiating means, wherein the above-described control part irradiates the surface silicon layer of the SOI substrate with the infrared rays while supplying a mixed gas of hydrogen gas and hydrocarbon gas into the film formation chamber and, thereby, the temperature of the surface silicon layer is raised to that required for metamorphosing the surface silicon layer into a single crystal silicon carbide thin film and this condition is maintained for a predetermined period of time so that this surface silicon layer is metamorphosed into the single crystal silicon carbide thin film.

In the case that such a manufacturing device is utilized, the same effects as of the above-described manufacturing method can be gained. In addition, an infrared ray irradiating means is used as a heating means in such a manufacturing device so that the temperature of the surface silicon layer of the SOI substrate is increased solely by means of infrared rays and, therefore, heat insulating equipment, and the like, involved in a resistance heating system or in an induction heating system together with the heater of the resistance heating system or the coil of the induction heating system become unnecessary unlike the prior art. As a result, a miniaturization of the device can be achieved to an extent greater than in the prior art. In addition, it is not necessary to provide wiring equipment within the film formation chamber in an airtight manner and therefore, a simplification of the device can be achieved. Furthermore, problems do not arise as in an induction heating system wherein the peripheral apparatuses suffer from electromagnetic interference due to induction.

What is claimed is:

1. A device for manufacturing a buried insulating layer type single crystal silicon carbide substrate within a film formation chamber after placing, in this film formation chamber, an SOI substrate having a buried insulating layer positioned on a silicon substrate and a surface silicon layer formed on this buried insulating layer, the manufacturing device for a buried insulating layer type silicon carbide substrate comprising:

a gas supplying means for supplying various types of gasses required for the manufacture of a buried insulating layer type semiconductor silicon carbide substrate into the film formation chamber;

an infrared ray irradiating means for irradiating the surface silicon layer of the SOI substrate with infrared rays; and a control means for controlling the gas supplying means and the infrared ray irradiating means, said control means controlling the gas supplying means to supply a mixed gas of hydrogen gas and hydrocarbon gas into the film formation chamber, while controlling the infrared ray irradiating means to raise under infrared irradiation the temperature of the surface silicon layer to that required for metamorphosing the surface silicon layer into a single crystal silicon carbide thin film, and maintaining this condition for a predetermined period of time so that the surface silicon layer is metamorphosed into a single crystal silicon carbide thin film.

2. The manufacturing device for a buried insulating layer type semiconductor silicon carbide substrate according to claim 1, wherein the manufacturing device for a buried insulating layer type semiconductor silicon carbide substrate is characterized in that said control part continues the process for metamorphosing the surface silicon layer into a single crystal silicon carbide thin film for a predetermined period of time after the start of said process, thereby deposits a carbon thin film on said single crystal silicon carbide thin film and, after that, replaces said mixed gas with an inert gas mixed with oxygen gas at a predetermined ratio and at the same time, achieves a temperature required for etching and removing said carbon thin film through the control of the irradiation of the infrared rays, and maintains this condition for a predetermined period of time so that the carbon thin film is etched and removed.

3. The manufacturing device for a buried insulating layer type semiconductor silicon carbide substrate according to claim 2, wherein the manufacturing device for a buried insulating layer type semiconductor silicon carbide substrate is characterized in that said control part replaces said inert gas with a pure inert gas with no oxygen gas mixed in after the process for etching and removing said carbon thin film and, after that, achieves a temperature required for making a new single crystal silicon carbide thin film to grow on said single crystal silicon carbide thin film through the control of the irradiation of the infrared rays while supplying a mixed gas of hydrogen gas and a silane based gas into the pure inert gas atmosphere, and maintains this condition for a predetermined period of time so that a new single crystal silicon carbide thin film is made to grow on the single crystal silicon carbide thin film.

4. The manufacturing device for a buried insulating layer type semiconductor silicon carbide substrate according to claim 3, wherein the manufacturing device for a buried insulating layer type semiconductor silicon carbide substrate is characterized in that said SOI substrate is a SIMOX substrate.

5. The manufacturing device for a buried insulating layer type semiconductor silicon carbide substrate according to claim 3, wherein the manufacturing device for a buried insulating layer type semiconductor silicon carbide substrate is characterized in that the film thickness of said surface silicon layer is 10 nm or less.

6. The manufacturing device for a buried insulating layer type semiconductor silicon carbide substrate according to claim 3, wherein the manufacturing device for a buried insulating layer type semiconductor silicon carbide substrate is characterized in that the air pressure within the film formation chamber is set at atmospheric pressure.

7. The manufacturing device for a buried insulating layer type semiconductor silicon carbide substrate according to claim 3, wherein the manufacturing device for a buried insulating layer type semiconductor silicon carbide substrate is characterized in that the position of said infrared ray irradiating means is adjustable.

8. The manufacturing device for a buried insulating layer type semiconductor silicon carbide substrate according to claim 7, wherein the manufacturing device for a buried insulating layer type semiconductor silicon carbide substrate is characterized in that said infrared ray irradiating means is placed outside a transparent film formation chamber.

9. The manufacturing device for a buried insulating layer type semiconductor silicon carbide substrate according to claim 1, 2, 3, 4, 5, 6, 7 or 8, wherein the manufacturing device for a buried insulating layer type semiconductor silicon carbide substrate is characterized by comprising a gas processing means for processing a gas supplied into said film formation chamber.

* * * * *